(12) United States Patent
Kadowaki

(10) Patent No.: US 11,334,102 B2
(45) Date of Patent: May 17, 2022

(54) POWER SUPPLY CIRCUITRY

(71) Applicants: Kabushiki Kaisha Toshiba, Tokyo (JP); Toshiba Electronic Devices & Storage Corporation, Tokyo (JP)

(72) Inventor: Hirokazu Kadowaki, Fujisawa Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 190 days.

(21) Appl. No.: 16/742,071

(22) Filed: Jan. 14, 2020

(65) Prior Publication Data

US 2021/0064071 A1  Mar. 4, 2021

(30) Foreign Application Priority Data

Sep. 4, 2019 (JP) .............................. JP2019-161265

(51) Int. Cl.
| | |
|---|---|
| *G05F 1/575* | (2006.01) |
| *H03F 3/45* | (2006.01) |
| *G05F 1/59* | (2006.01) |
| *H03F 3/345* | (2006.01) |

(52) U.S. Cl.
CPC ................ *G05F 1/575* (2013.01); *G05F 1/59* (2013.01); *H03F 3/345* (2013.01); *H03F 3/45* (2013.01); *H03F 2203/45138* (2013.01)

(58) Field of Classification Search
CPC ... G05F 1/575; G05F 1/59; G05F 1/56; G05F 1/595; H03F 3/45; H03F 2203/45138; H03F 3/45475; H03F 3/345
See application file for complete search history.

(56) References Cited

U.S. PATENT DOCUMENTS

| | | |
|---|---|---|
| 8,283,906 B2 | 10/2012 | Shito |
| 9,141,121 B2 | 9/2015 | Nihei et al. |
| 9,618,951 B2 | 4/2017 | Kobayashi et al. |
| 10,177,655 B2 | 1/2019 | Tsuzaki et al. |

(Continued)

FOREIGN PATENT DOCUMENTS

| | | |
|---|---|---|
| JP | 2010-191885 A | 9/2010 |
| JP | 2012-185595 A | 9/2012 |
| JP | 2014-67394 A | 4/2014 |

(Continued)

*Primary Examiner* — Jung Kim
(74) *Attorney, Agent, or Firm* — Allen & Overy LLP

(57) ABSTRACT

A power supply circuitry includes a first transistor, a feedback circuit, a first differential amplifier circuit, a second differential amplifier circuit, and a first control circuit. The first transistor outputs a power supply voltage based on a drive signal. The feedback circuit generates a feedback voltage of the power supply voltage. The first differential amplifier circuit amplifies a difference between the feedback voltage and a reference voltage, and outputs the drive signal. The second differential amplifier circuit amplifies a difference between the reference voltage and the feedback voltage. The first control circuit detects a change in the power supply voltage by using a differentiation circuit and controls the power supply voltage based on an output of the second differential amplifier circuit.

10 Claims, 4 Drawing Sheets

(56) References Cited

U.S. PATENT DOCUMENTS

2014/0266118 A1\* 9/2014 Chern .................. H02M 3/156
    323/283

FOREIGN PATENT DOCUMENTS

| JP | 2015-7903   | A  | 1/2015  |
|----|-------------|----|---------|
| JP | 2015-18417  | A  | 1/2015  |
| JP | 2015-79307  | A  | 4/2015  |
| JP | 5821497     | B2 | 11/2015 |
| JP | 6216171     | B2 | 10/2017 |

\* cited by examiner

– 1 –

POWER SUPPLY CIRCUITRY

CROSS REFERENCE TO RELATED APPLICATIONS

This application is based upon and claims the benefit of priority from the prior Japanese Patent Application No. 2019-161265, filed on Sep. 4, 2019, the entire contents of which are incorporated by reference.

FIELD

The embodiments of the present invention relate to a power supply circuitry.

BACKGROUND

A LDO (Low Drop Out) provides feedback of an output voltage to a drive voltage of an output transistor when a load current is changed, thereby operating so that the output voltage becomes constant even when the change in the load current occurs. However, when the load current is changed rapidly, a delay of an internal circuit sometimes causes negative feedback operation to take time, which delays timing when an output current of the output transistor is reduced. In this case, regardless of a reduction in the load current, the LDO continues making the output current flow, so that the output voltage of the LDO rises more than a prescribed value.

DETAILED DESCRIPTION

Figure 1:
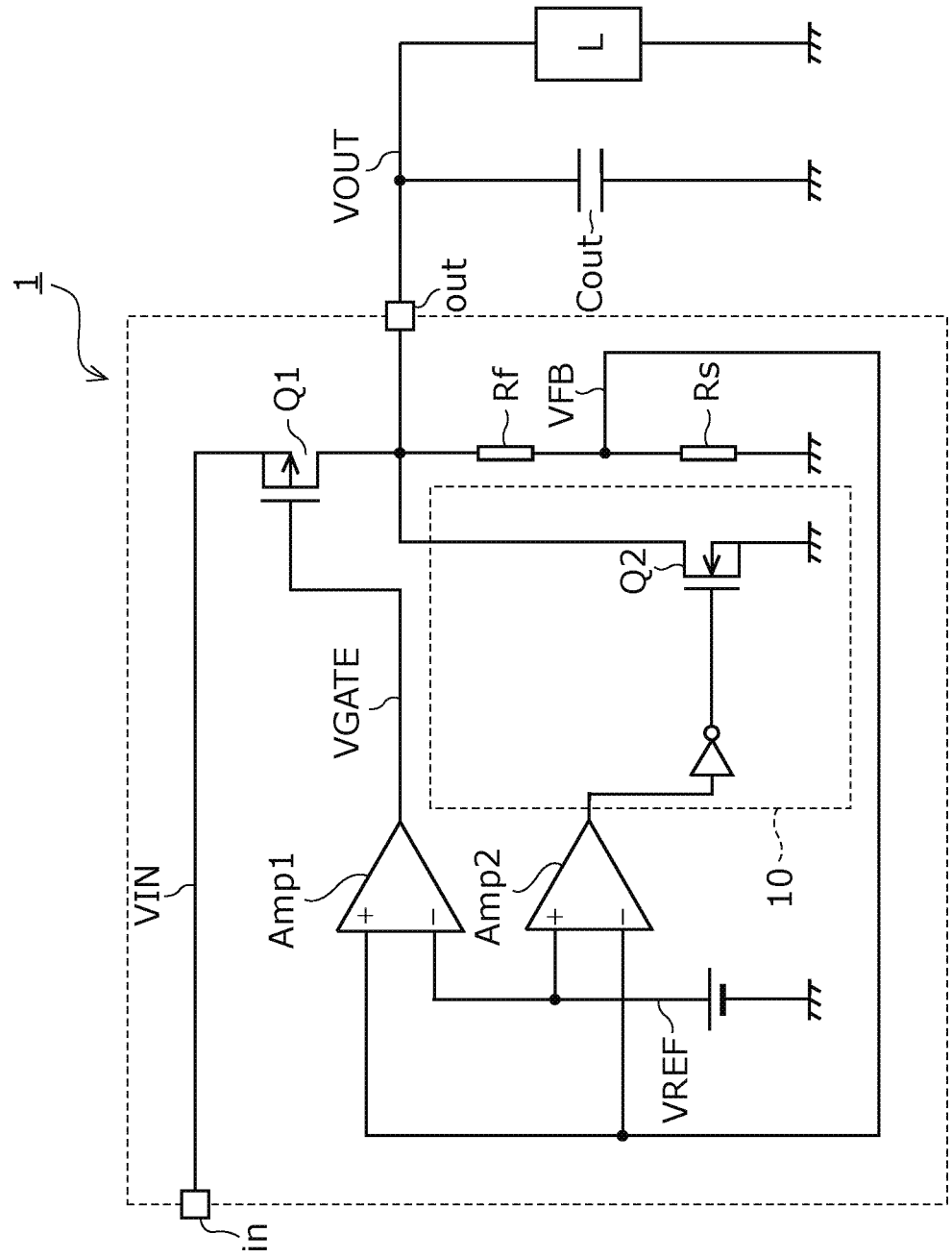
FIG. 1 is a circuitry diagram illustrating an example of a power supply circuitry according to one embodiment.

According to some embodiments, a power supply circuitry includes a first transistor, a feedback circuit, a first differential amplifier circuit, a second differential amplifier circuit, and a first control circuit. The first transistor outputs a power supply voltage based on a drive signal. The feedback circuit generates a feedback voltage of the power supply voltage. The first differential amplifier circuit amplifies a difference between the feedback voltage and a reference voltage, and outputs the drive signal. The second differential amplifier circuit amplifies a difference between the reference voltage and the feedback voltage. The first control circuit detects a change in the power supply voltage by using a differentiation circuit and controls the power supply voltage based on an output of the second differential amplifier circuit.

Hereinafter, embodiments will be explained with reference to the drawings. In the drawings, for example, an input power supply is not connected to an amplifier circuit, a buffer circuit, and the like, but is properly connected to Vdd and GND. Further, the explanation is made by selecting substantial parts according to the embodiments, and the further presence of other essential parts is not eliminated.

First Embodiment

FIG. 1 is a circuitry diagram of a power supply circuitry according to a first embodiment. A power supply circuitry 1 is, for example, a LOD power supply circuitry, includes a first transistor Q1, resistors Rf and Rs, and a first differential amplifier circuit Amp, and outputs a controlled power supply voltage to an external load L. A capacitor Cout is a capacitor provided outside or inside the power supply circuitry 1, and for example, operates as a bypass capacitor. The power supply circuitry 1 further includes a first control circuit 10 having an inverter and a second transistor Q2, and a second differential amplifier circuit Amp2 other than the above-described basic circuit elements. A power supply voltage VOUT outputted by the power supply circuitry 1 is changed according to a state of the external load L, in more detail, a load current flowing through the external load L. In the power supply circuitry 1, a power supply voltage VIN as the entire circuitry in which the power supply circuitry 1 is incorporated is inputted to an input terminal in, and the power supply voltage VOUT with respect to the external load L is outputted from an output terminal out.

The first transistor Q1 is, for example, a p-type MOSFET (Metal-Oxide-Semiconductor Field-Effect-Transistor), and has a source to which the input voltage VIN is applied, a gate connected to the first differential amplifier circuit Amp1, and a drain connected to the output terminal. Through the first transistor Q1, a drain current flows based on a drive voltage VGATE applied to the gate and the input voltage VIN applied to the source. This drain current flows via the resistors Rf and Rs to a ground surface, thereby outputting the generated power supply voltage outside.

The resistor Rf has one terminal connected to the drain of the first transistor Q1 and the other terminal connected to the resistor Rs, and is grounded via the resistor Rs. The resistor Rs has one terminal which is connected to the resistor Rf and the other terminal which is grounded. These resistors Rf and Rs define the voltage outputted as described above, and operate as a feedback circuit which, from a node between the resistors Rf and Rs, generates a feedback voltage VFB in order to control the drive voltage VGATE.

The first differential amplifier Amp1 is a circuit which generates a drive voltage of the first transistor Q1, and has a non-inverting terminal connected to the node between the resistors Rf and Rs, namely, the feedback circuit, an inverting terminal to which a reference voltage is applied, and an output connected to the gate of the first transistor Q1. The first differential amplifier Amp1 amplifies a difference between a reference voltage VREF and the feedback voltage VFB, generates the drive voltage VGATE, and applies it to the gate of the first transistor Q1.

For example, when an electric potential of the drain of the first transistor Q1 is lowered, the feedback voltage is reduced, which makes a voltage outputted by the first differential amplifier circuit 1 low. This makes a voltage of the drive voltage VGATE low and causes the drain current of the first transistor Q1 to be increased, thereby making the power supply voltage to be outputted high.

Conversely, when the electric potential of the drain of the first transistor Q1 is raised, the feedback voltage is increased, which makes the voltage outputted by the first differential amplifier circuit 1 high. This makes the voltage of the drive voltage VGATE high and causes the drain current of the first transistor Q1 to be reduced, thereby making the power supply voltage to be outputted low.

Thus, also when the load current is changed due to the external load L, the power supply circuitry 1 outputs a stable voltage. However, when the load current is changed rapidly, a delay in the above-described operation occurs, which makes it difficult to return to supply of the stable voltage soon. Thus, a first control circuit 10 and a second differential amplifier circuit Amp2 operate. Note that, in the following explanation, an output voltage control circuit is set to include at least one of the first control circuit 10 and the later-described second control circuit 12, but moreover, the output voltage control circuit may be configured to also include the second differential amplifier circuit Amp2.

The second differential amplifier circuit Amp2 has a non-inverting terminal to which the reference voltage VREF is applied, and an inverting terminal which is connected to the feedback circuit and to which the feedback voltage VFB is applied. That is, the second differential amplifier circuit Amp2 amplifies and outputs a difference VREF–VEB between the reference voltage VREF and the feedback voltage VFB.

The second transistor Q2 is, for example, an n-type MOSFET which has a gate which is connected via the inverter to an output of the second differential amplifier circuit Amp2, a drain which is connected to the drain of the first transistor Q1, and a source which is grounded. When an absolute value of a voltage outputted by the second differential amplifier circuit Amp2 is higher than a threshold voltage, a part of or the entire drain current of the first transistor Q1 is made to flow to the ground surface. This current flows until the absolute value of the voltage outputted by the second differential amplifier circuit Amp2 is lower than the threshold voltage, but an amount of the current is reduced with a reduction in the feedback voltage VFB.

As described above, the higher power supply voltage VOUT turns the second transistor Q2 on to make a current flow to the drain of the first transistor Q1, namely, from the output terminal to the ground surface, thereby allowing the power supply voltage to be controlled to the stable voltage with higher speed than in the absence of the first control circuit 10.

Second Embodiment

According to the first embodiment, it is possible to stabilize the power supply voltage with high speed by using the first control circuit 10, but when a rapid reduction of the load current occurs, the power supply voltage VOUT is likely to be reduced too much as a transient response. Thus, in this embodiment, elements which limit the operation of a first control circuit 10 are added.

Figure 2:
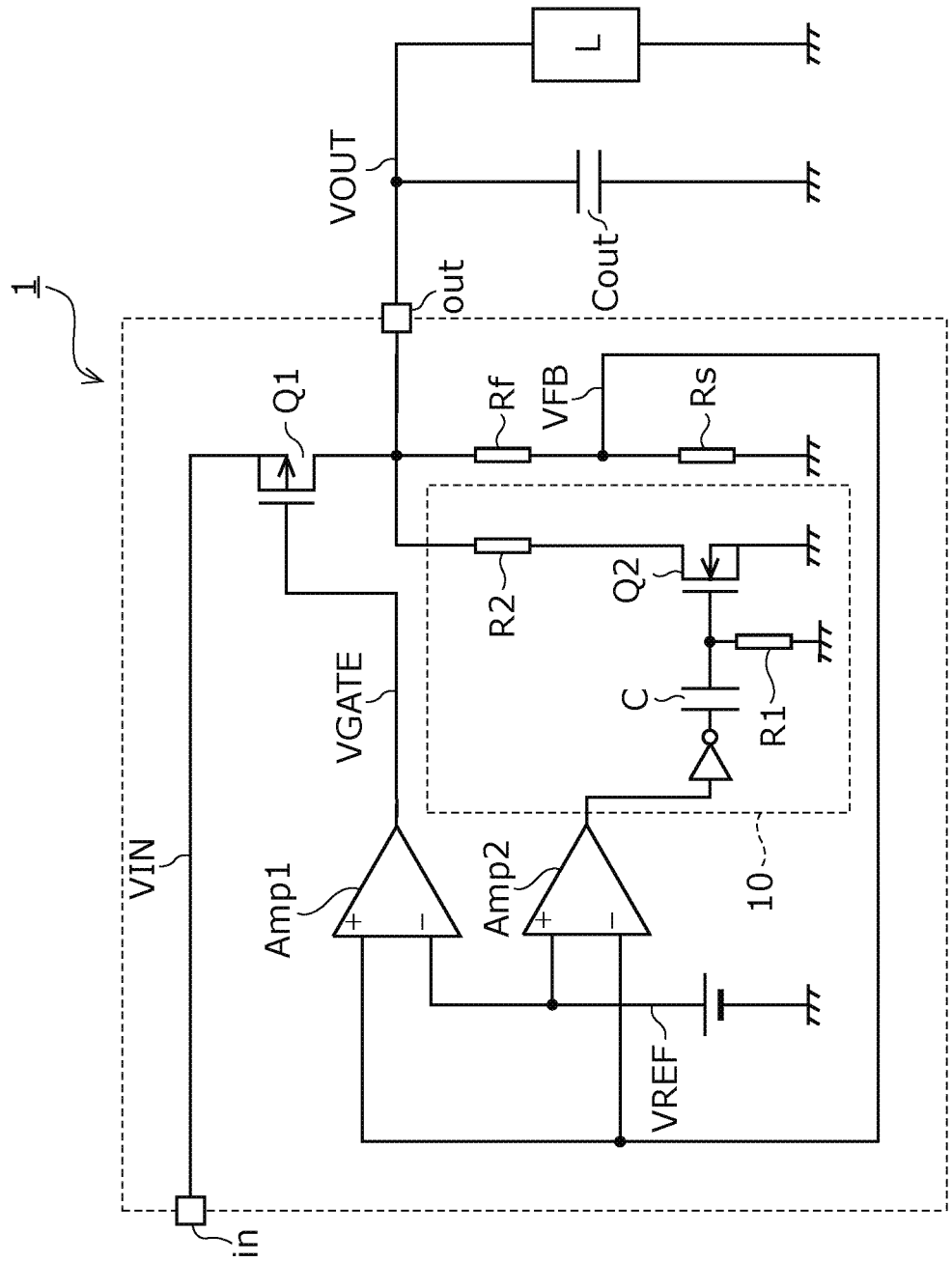
FIG. 2 is a circuitry diagram illustrating an example of a power supply circuitry according to one embodiment.

FIG. 2 is a circuitry diagram of a power supply circuitry 1 according to this embodiment. The first control circuit 10 further includes a capacitor C and resistors R1 and R2 in addition to an inverter and a second transistor Q2. Note that a configuration of including either of a combination of the capacitor C and the resistor R1, and the resistor R2 is also applicable. That is, a configuration of including the capacitor C and the resistor R1 but not including the resistor R2 is also applicable, or a configuration of not including the capacitor C and the resistor R1 but including the resistor R2 is also applicable.

The capacitor C is connected in series between the inverter and a gate of the second transistor Q2. The resistor R1 is connected in parallel between the capacitor C and the gate of the second transistor Q2. By the capacitor C and the resistor R1, a high-pass filter (differentiation circuit) is configured.

Thus including the high-pass filter in the first control circuit 10 makes it possible to apply this transient response component amplified by a second differential amplifier circuit Amp2 to the gate of the second transistor Q2 at timing when the load current is reduced rapidly to make the power supply voltage high. That is, by including the high-pass filter, when the load current is reduced rapidly, it is possible to apply the drive voltage based on this rapid change to the second transistor Q2 at the timing.

Further, a time constant of this high-pass filter becomes R1×C. Based on this, by presuming a time during which a voltage of the drain of a first transistor Q1 is sufficiently reduced, a resistance value of the resistor R1 and a capacitance of the capacitor C may be set so that an appropriate amount of a drain current flows from the second transistor Q2 based on this presumed time.

Thus, including the high-pass filter makes it possible not to control a discharge for a continuously strong voltage drop, but to change timing of the voltage drop and strength thereof temporally, and supply a voltage stabilized to the extent that the transient response does not occur.

As above, including the high-pass filter (differentiation circuit) allows detection of the rapid reduction of the load current, and makes it possible to, with better accuracy, control the power supply voltage outputted by the power supply circuitry 1 when such a rapid reduction of the load current occurs. That is, including the differentiation circuit makes it possible to, based on magnitude and time in each of which the load current is reduced, with good timing and with an amount in which a voltage is reduced and a time speed at which a voltage is reduced adjusted, control the power supply voltage. As a result, in a case of the reduction in the load current, as compared with a case of reducing the power supply voltage continuously, it becomes possible to achieve low power consumption, and suppress oscillation due to the circuit which reduces the power supply voltage.

As described above, the first control circuit 10 may include the resistor R2. The resistor R2 operates as a current limiting circuit which limits a current flowing via the second transistor Q2. Including the resistor R2 makes it possible to provide a potential difference between the drain of the first transistor Q1 and the drain of the second transistor Q2. By providing this potential difference, a drain voltage of the second transistor Q2 may be controlled to control the drain current flowing through the second transistor Q2. Thus, by including the resistor R2, the limit may be imposed so as not to rapidly reduce the power supply voltage too much in the control of the power supply voltage to be outputted, as compared with a case of the absence of the resistor R2.

Third Embodiment

In the above-described respective embodiments, by a discharge from the electric potential of the drain of the first transistor Q1 connected to the output terminal, the power supply voltage has been controlled by dropping the power supply voltage, but this is not restrictive. In this embodiment, by controlling a drive voltage of a first transistor Q1, an attempt to lower the electric potential of the drain of the first transistor Q1 is made.

Figure 3:
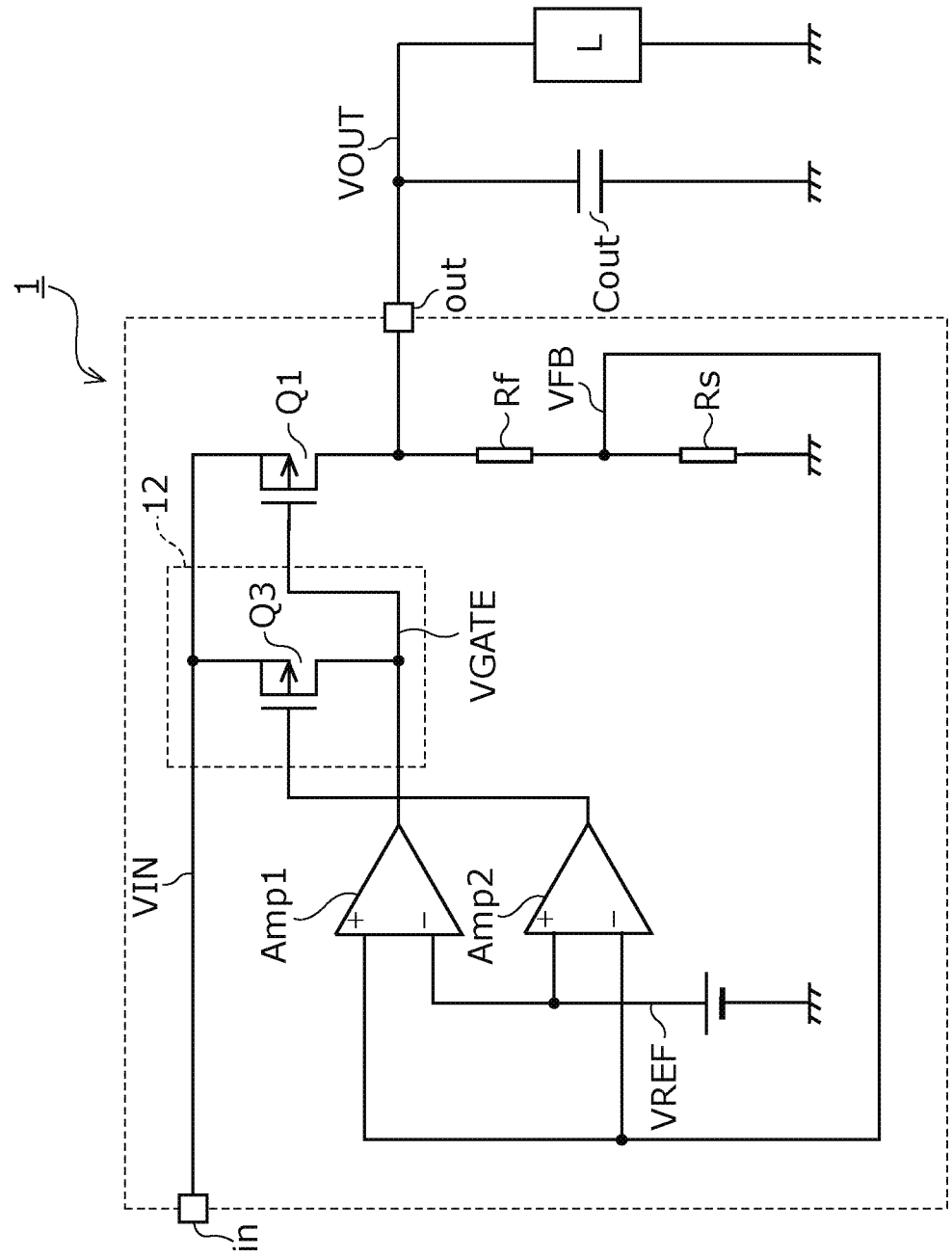
FIG. 3 is a circuitry diagram illustrating an example of a power supply circuitry according to one embodiment.

FIG. 3 is a circuitry diagram of a power supply circuitry 1 according to this embodiment. The power supply circuitry 1 includes a second control circuit 12 having a third transistor Q3.

The third transistor Q3 is, for example, a p-type MOSFET, and has a gate connected to an output of a second differential amplifier circuit Amp2, a source connected to a source of the first transistor Q1, and a drain connected to a gate of the first transistor Q1.

When a reduction in a load current makes a power supply voltage VOUT high, a voltage outputted by the second differential amplifier circuit Amp2 is reduced. In the third transistor Q3, the voltage applied to the gate is reduced, which increases a drain current. The increase in the drain current makes a drive voltage VGATE high, which makes a voltage applied to the gate of the first transistor Q1 high, resulting in a reduction in a drain current of the first transistor Q1.

Further, when the voltage applied to the gate of the third transistor Q3 is increased, a threshold and the output of the second differential amplifier circuit Amp2 may be adjusted by a circuit coefficient or the like so that the third transistor Q3 is in a saturated state. By such a manner, the gate and the source of the first transistor Q1 can be short-circuited via the third transistor Q3 when the load current is rapidly reduced, namely when a feedback voltage is rapidly increased. Thus, the drain current of the first transistor Q1 can be controlled not to flow temporarily by the short circuit.

As a result, it becomes possible to lower the electric potential of the drain of the first transistor Q1 and make the power supply voltage VOUT to be outputted low.

As above, based on the second control circuit 12 according to this embodiment, the second control circuit 12 is connected between the gate and the source of the output transistor, and the gate and the source of the output transistor are short-circuited based on the feedback voltage, thereby allowing high-speed stabilization of the power supply voltage when the rapid reduction of the load current occurs.

Fourth Embodiment

In the above-described respective embodiments, the first control circuit and the second control circuit have been explained, but in this embodiment, a power supply circuitry 1 includes both a first control circuit and a second control circuit.

Figure 4:
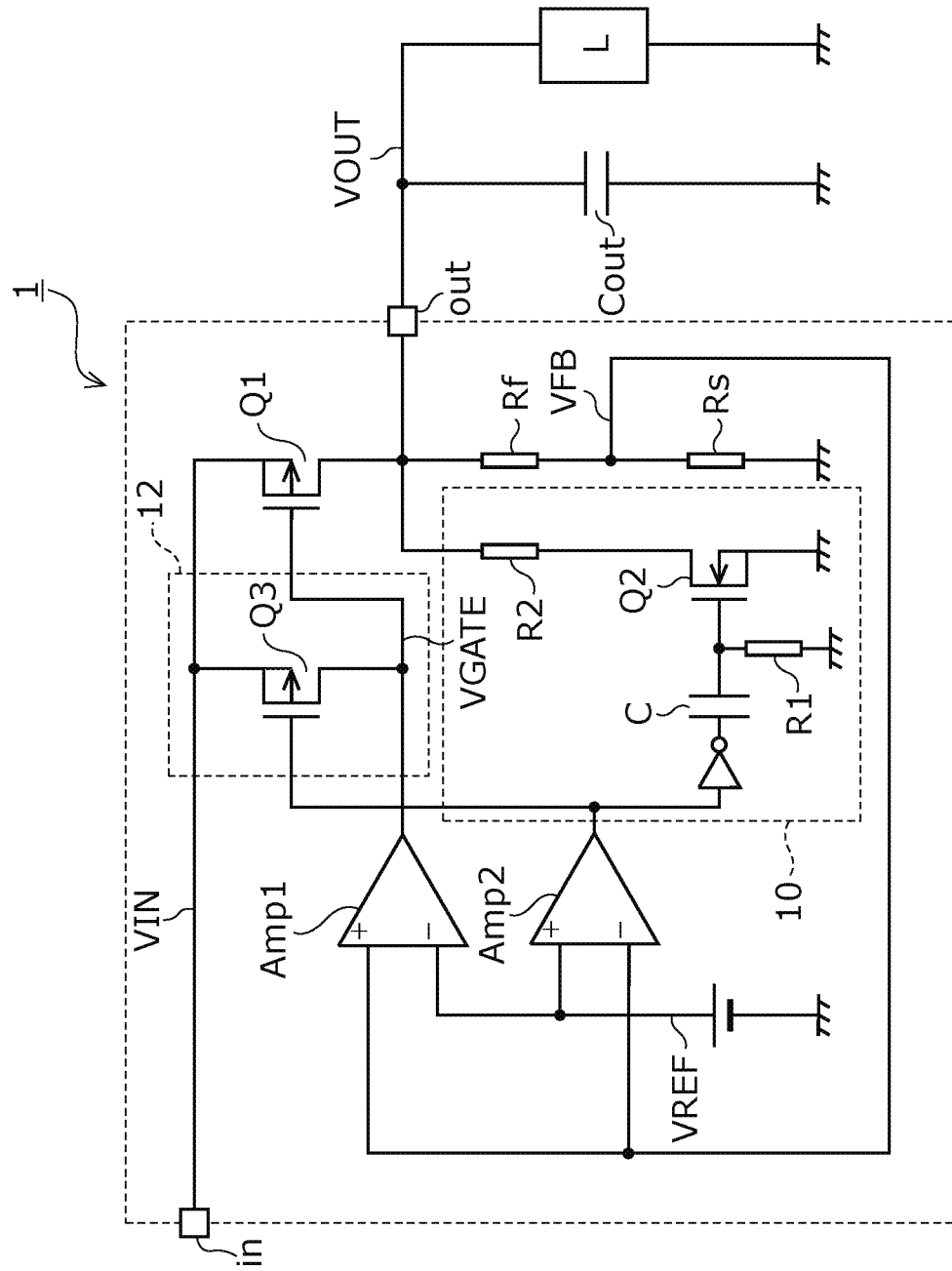
FIG. 4 is a circuitry diagram illustrating an example of a power supply circuitry according to one embodiment.

FIG. 4 illustrates a circuitry diagram of a power supply circuitry 1 according to this embodiment. The power supply circuitry 1 includes a first transistor Q1, resistor Rf and Rs, and a first differential amplifier circuit Amp1 which configure a typical LDO, and further includes a first control circuit 10 and a second control circuit 12. The first control circuit 10 has a second differential amplifier circuit Amp2, a capacitor C, resistor R1 and R2, and a second transistor Q2. The second control circuit 12 has a third transistor Q3.

Since the operation of each circuit has been explained in the above-described respective embodiments, details are omitted.

The power supply circuitry 1 according to this embodiment includes the first control circuit 10 which, when a load current is reduced rapidly, via a differentiation circuit, based on timing when the load current is reduced and a degree of the reduction in the load current, drops an output voltage of the output transistor (the first transistor Q1) by imposing a limit on a discharged current, and the second control circuit 12 which reduces a drain current of the output transistor at the same timing.

Thus, by using the two control circuits, also when the rapid reduction of the load current makes the power supply voltage rapidly high, it becomes possible to output a stable power supply voltage appropriately based on the timing, and the magnitude of the reduction.

As above, according to this embodiment, when the rapid reduction of the load current occurs, the first control circuit 10 having the differentiation circuit controls timing of dropping the power supply voltage, or the like, and controls both an electric potential of a drain and a drain current of the output transistor, thereby allowing faster return and stabilization of the power supply voltage.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the above-described explanation, a section being the n-type MOSFET can be appropriately changed to the p-type MOSFET, and the inverse of the above is also similar. Further, the MOSFETs can also be each replaced with a bipolar transistor having an appropriate coefficient. In these cases, a gate, a source, and a drain of each of the MOSFETs and a base, an emitter, and a collector of the bipolar transistor are appropriately replaced with one another respectively.

The invention claimed is:

1. A power supply circuitry comprising:
a first transistor configured to output a power supply voltage based on a drive signal;
a feedback circuit configured to generate a feedback voltage of the power supply voltage;
a first differential amplifier circuit configured to amplify a difference between the feedback voltage and a reference voltage, and output the drive signal;
a second differential amplifier circuit configured to amplify a difference between the reference voltage and the feedback voltage;
a first control circuit configured to detect a change in the power supply voltage by using a differentiation circuit and control the power supply voltage based on an output of the second differential amplifier circuit; and
a second control circuit configured to control the drive signal based on the output of the second differential amplifier circuit.

2. The power supply circuitry according to claim 1, wherein the first control circuit is connected to an output of the first transistor, and controls the power supply voltage based on the output of the second differential amplifier circuit.

3. The power supply circuitry according to claim 2, wherein the first control circuit comprises
a second transistor connected to the output of the first transistor, the second transistor configured to make a current flow from the output of the first transistor and control the power supply voltage based on a signal outputted by the second differential amplifier circuit.

4. The power supply circuitry according to claim 3, wherein the differentiation circuit controls timing when a current is made to flow from the output of the first transistor based on the signal outputted by the second differential amplifier circuit.

5. The power supply circuitry according to claim 4, wherein the differentiation circuit comprises: a resistor; and a capacitor, and controls timing when a current is made to flow from the output of the first transistor based on a resistance value and a capacitance value.

6. The power supply circuitry according to claim 3, wherein the first control circuit further comprises
a current limiting circuit connected to the second transistor, the current limiting circuit configured to limit a current flowing via the second transistor.

7. The power supply circuitry according to claim 1, wherein the second control circuit comprises
a third transistor configured to control a voltage of the drive signal based on the output of the second differential amplifier circuit.

8. A power supply circuitry comprising:
a first transistor configured to output a power supply voltage based on a drive signal;
a feedback circuit connected to an output of the first transistor, the feedback circuit configured to generate a feedback voltage of the power supply voltage;
a first differential amplifier circuit having a non-inverting terminal to which the feedback circuit is connected, an inverting terminal to which a reference voltage is applied, and an output connected to a drive terminal of the first transistor;
a second differential amplifier circuit having a non-inverting terminal to which the reference voltage is applied, and an inverting terminal connected to the feedback circuit; and
an output voltage control circuit connected to an output of the second differential amplifier circuit, and having a differentiation circuit which detects a change in the power supply voltage based on the output of the second differential amplifier circuit, the output voltage control circuit configured to control the power supply voltage.

9. The power supply circuitry according to claim 8, wherein the output voltage control circuit further comprises
a second transistor having a source and a drain, one of which is connected to the output of the first transistor, and the source and the drain, the other of which is connected to a ground voltage,
wherein the differentiation circuit comprises: a capacitor; and a resistor,
wherein the capacitor has one end connected to the output of the second differential amplifier circuit, and the other end connected to a gate of the second transistor, and
wherein the resistor has one end connected to the other end of the capacitor, and the other end connected to the ground voltage.

10. The power supply circuitry according to claim 8, comprising
a third transistor having a gate connected to the output of the second differential amplifier circuit, and a source and a drain, one of which is connected to the output of the first differential amplifier circuit, and the source and the drain, the other of which is connected to an input voltage,
wherein the input voltage is inputted to the first transistor.

* * * * *